(12) United States Patent
Hsieh et al.

(10) Patent No.: US 8,822,343 B2
(45) Date of Patent: Sep. 2, 2014

(54) ENHANCED FINFET PROCESS OVERLAY MARK

(75) Inventors: Chi-Wen Hsieh, Hsinchu (TW);
Chi-Kang Chang, New Taipei (TW);
Chia-Chu Liu, Shin-Chu (TW);
Meng-Wei Chen, Taichung (TW);
Kuei-Shun Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/602,697

(22) Filed: Sep. 4, 2012

(65) Prior Publication Data
US 2014/0065832 A1   Mar. 6, 2014

(51) Int. Cl.
*H01L 21/308* (2006.01)

(52) U.S. Cl.
USPC ............... 438/703; 257/797; 257/E23.179; 257/E21.233

(58) Field of Classification Search
USPC ......................................................... 438/703
See application file for complete search history.

(56) References Cited

U.S. PATENT DOCUMENTS

| 2012/0038021 A1 | 2/2012 | Chen et al. | |
| 2012/0235247 A1* | 9/2012 | Cai et al. | 257/392 |
| 2013/0005127 A1* | 1/2013 | Yin et al. | 438/585 |

\* cited by examiner

*Primary Examiner* — Mamadou Diallo
(74) *Attorney, Agent, or Firm* — Haynes and Boone, LLP

(57) ABSTRACT

An overlay mark suitable for use in manufacturing nonplanar circuit devices and a method for forming the overlay mark are disclosed. An exemplary embodiment includes receiving a substrate having an active device region and an overlay region. One or more dielectric layers and a hard mask are formed on the substrate. The hard mask is patterned to form a hard mask layer feature configured to define an overlay mark fin. Spacers are formed on the patterned hard mask layer. The spacers further define the overlay mark fin and an active device fin. The overlay mark fin is cut to form a fin line-end used to define a reference location for overlay metrology. The dielectric layers and the substrate are etched to further define the overlay mark fin.

13 Claims, 16 Drawing Sheets

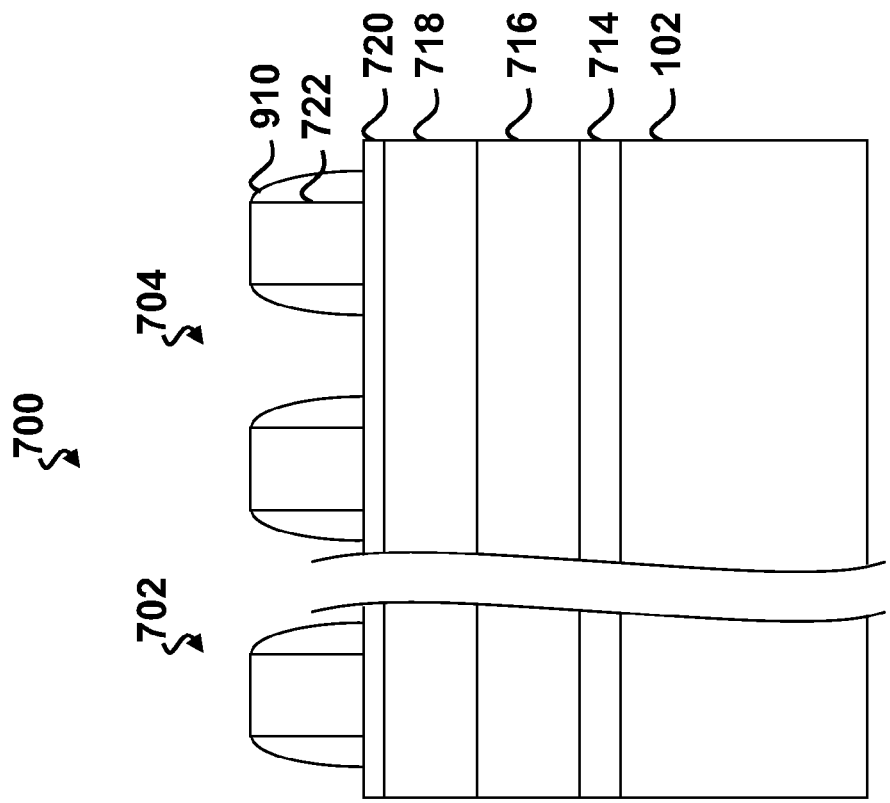
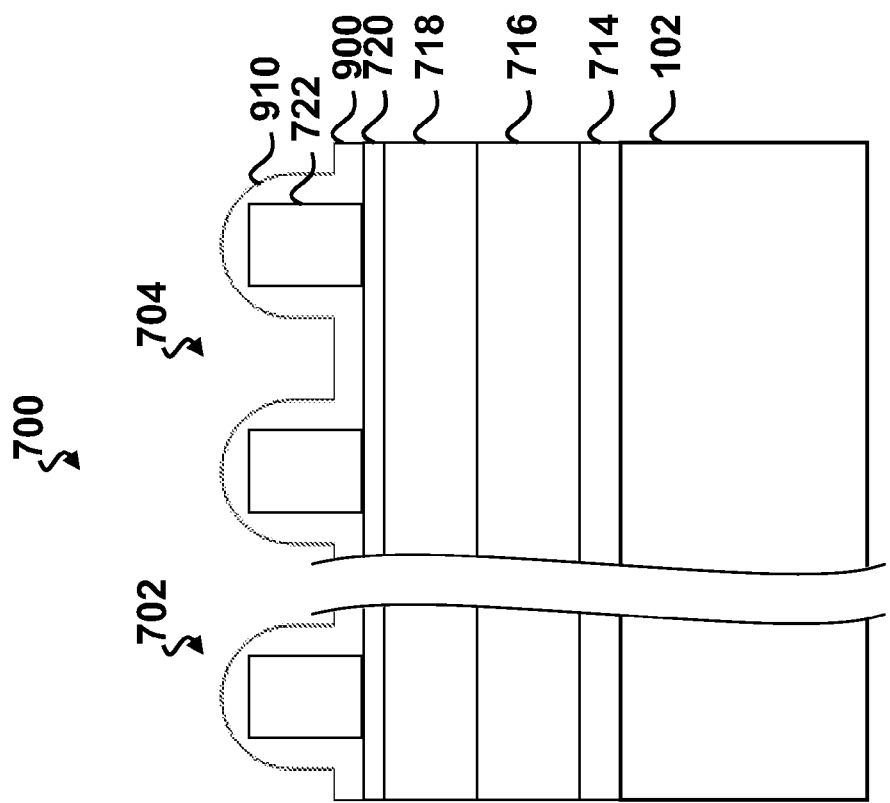

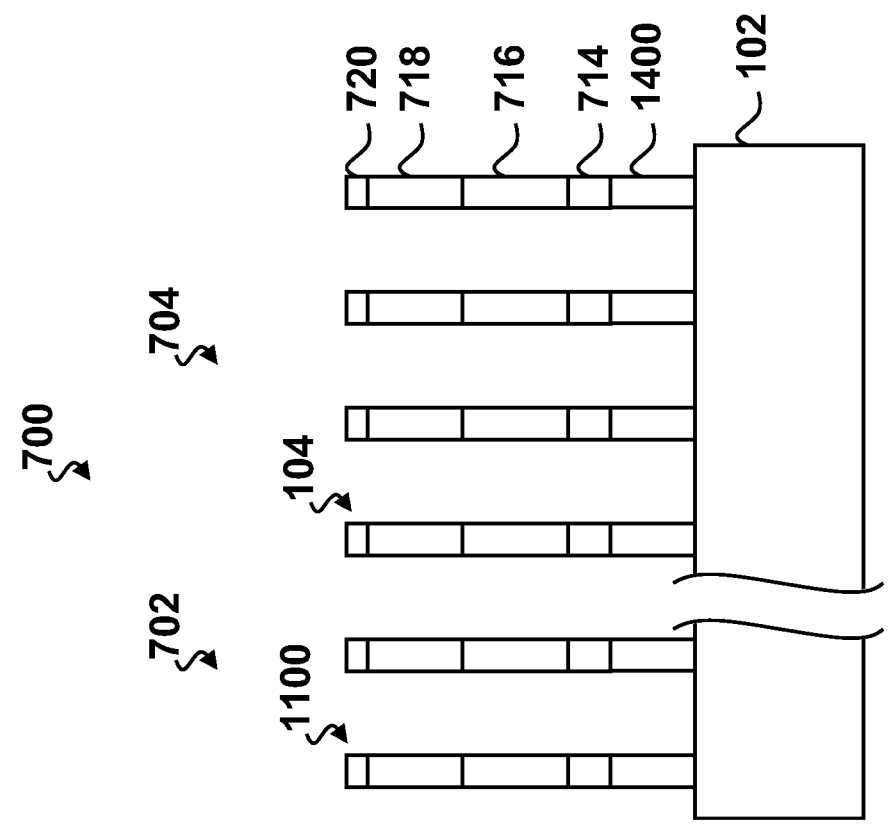
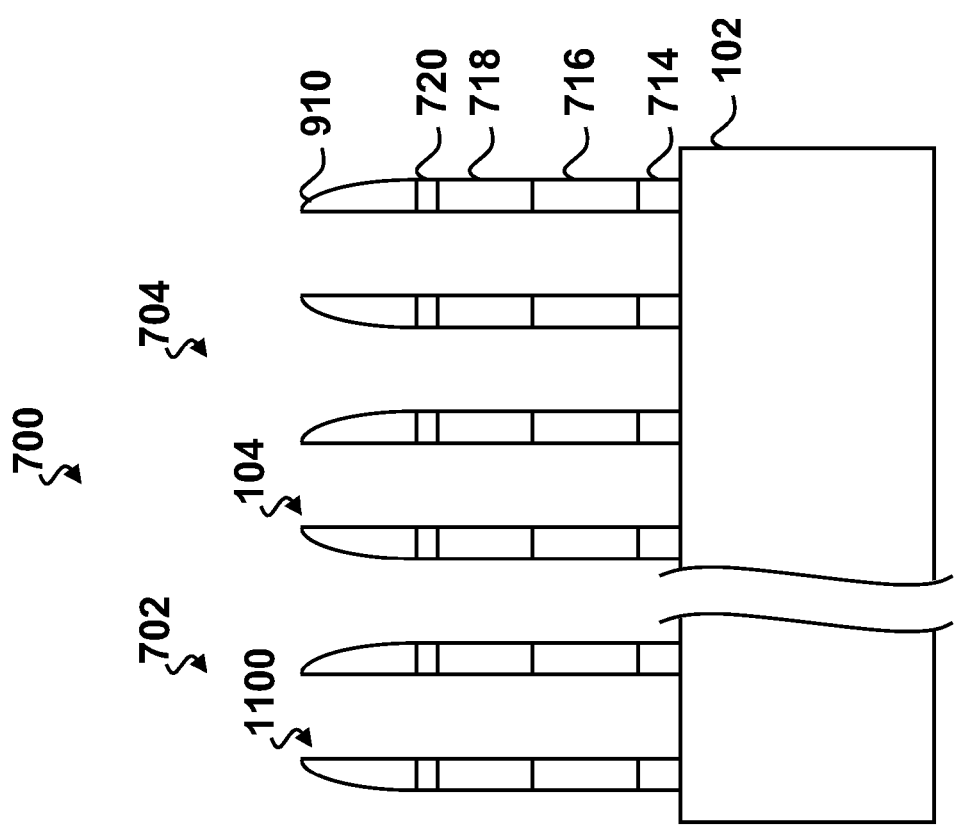

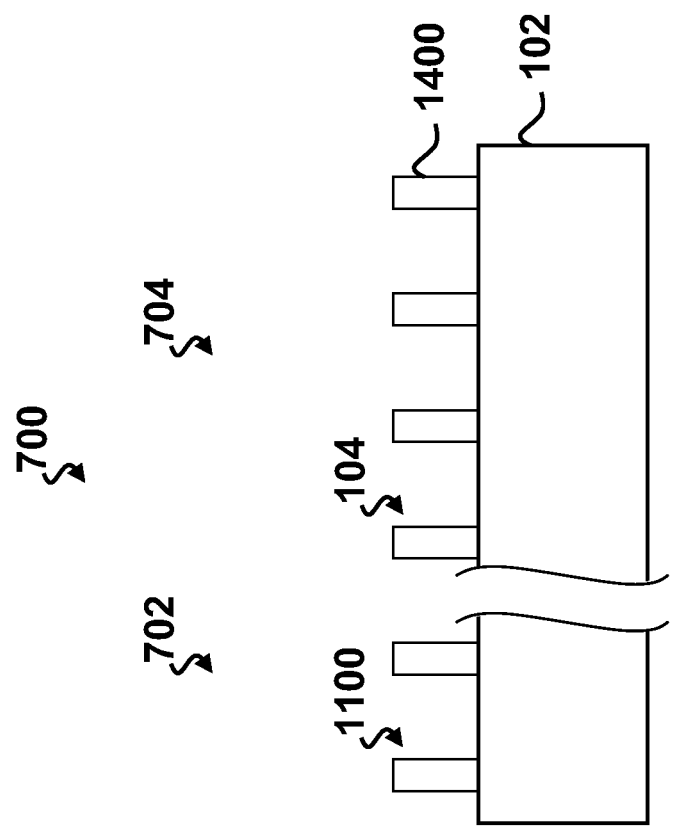

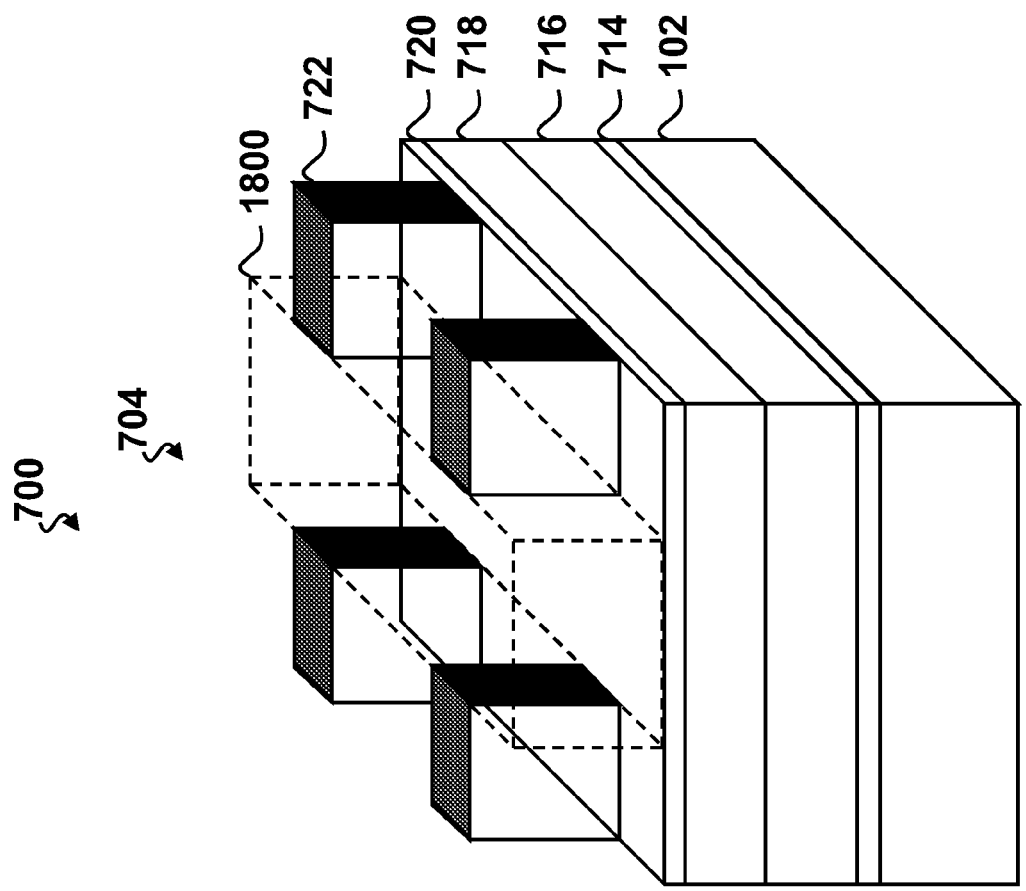
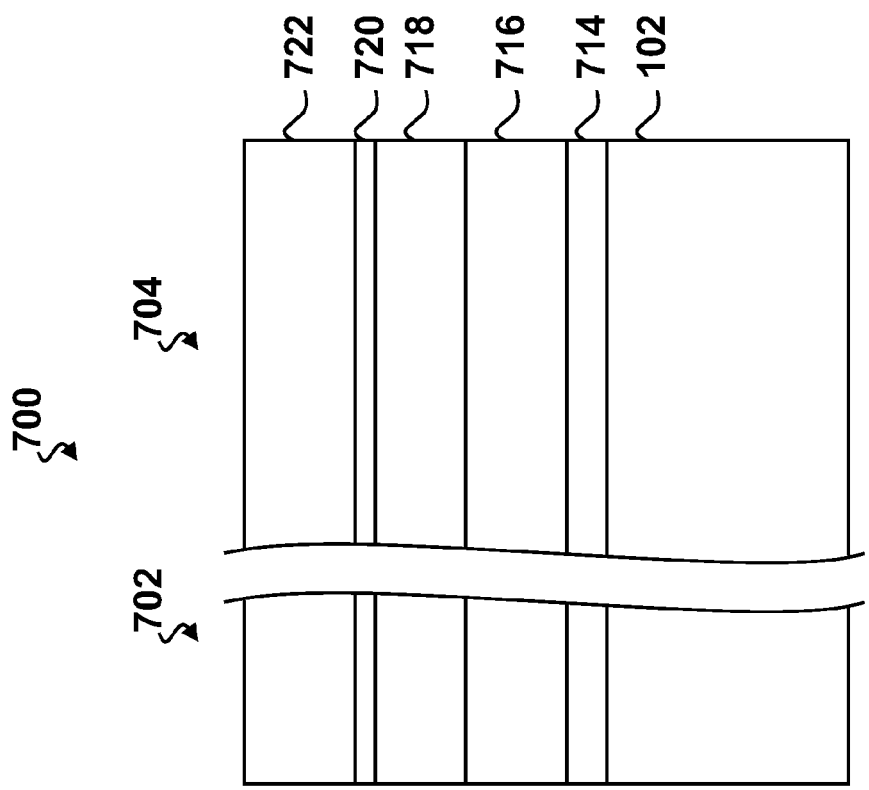

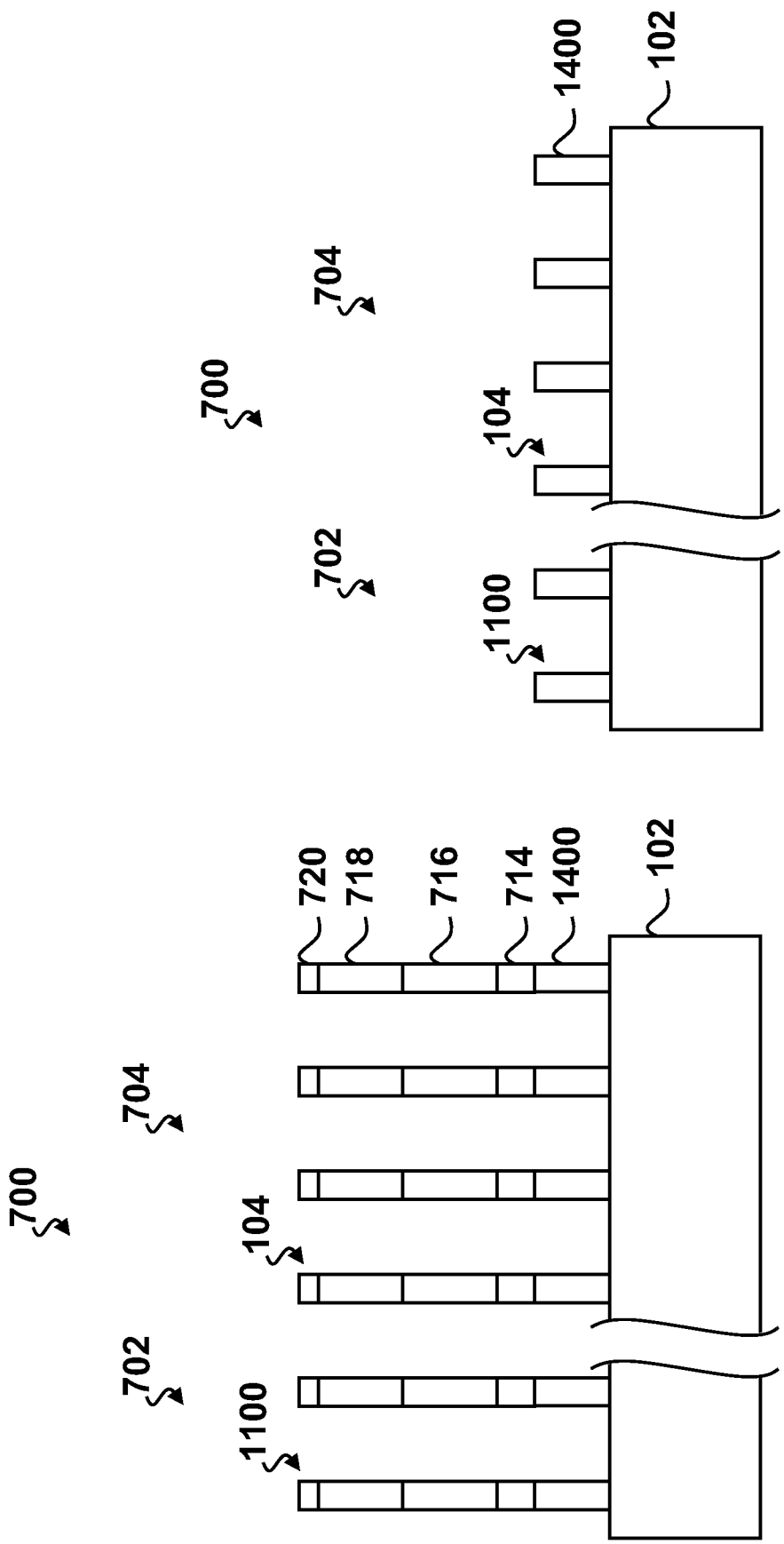

ENHANCED FINFET PROCESS OVERLAY MARK

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A typical FinFET is fabricated with a thin "fin" (or fin structure) extending from a substrate, for example, etched into a silicon layer of the substrate. The channel of the FET is formed in this vertical fin. A gate is provided over (e.g., wrapping) the fin. It is beneficial to have a gate on both sides of the channel allowing gate control of the channel from both sides. Advantages of FinFET devices include reducing the short channel effect and higher current flow.

Because of the complexity inherent in nonplanar devices, such as FinFETs, a number of techniques used in manufacturing planar transistors must be redesigned for manufacturing nonplanar devices. For example, mask overlay and alignment techniques may require further design efforts. ICs (integrated circuits) are typically assembled by layering features on a semiconductor wafer using a set of photolithographic masks. Each mask in the set has a pattern formed by transmissive or reflective regions. During a photolithographic exposure, radiation such as ultraviolet light passes through or reflects off the mask before striking a photoresist coating on the wafer. The mask transfers the pattern onto the photoresist, which is then selectively removed to reveal the pattern. The wafer then undergoes processing steps that take advantage of the shape of the remaining photoresist to create circuit features on the wafer. When the processing steps are complete, photoresist is reapplied and wafer is exposed using the next mask. In this way, the features are layered to produce the final circuit.

Regardless of whether a mask is error-free, if all or part of the mask is not aligned properly, the resulting features may not align correctly with adjoining layers. This can result in reduced device performance or complete device failure. To measure mask alignment, overlay (OVL) marks are formed on the wafer. Overlay marks typically consist of layers of material arranged in patterns that are both recognizable and that provide identifiable reference points. While existing overlay marks have been generally adequate for planar devices, they have not been entirely satisfactory for manufacturing nonplanar devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7-11 are sectional views of an IC precursor undergoing a method of forming overlay fins and active device fins according to aspects of the present disclosure.

FIGS. 13-15 are sectional views of an IC precursor undergoing a method of forming overlay fins and active device fins according to aspects of the present disclosure.

FIG. 17 is a sectional view of an IC precursor undergoing a method of forming an overlay mark and an active device structure according to aspects of the present disclosure.

FIG. 18 is a perspective view of an overlay region of an IC precursor undergoing a method of forming an overlay mark and an active device structure according to aspects of the present disclosure.

FIGS. 19-24 are sectional views of an IC precursor undergoing a method of forming an overlay mark and an active device structure according to aspects of the present disclosure.

DETAILED DESCRIPTION

Figure 1:
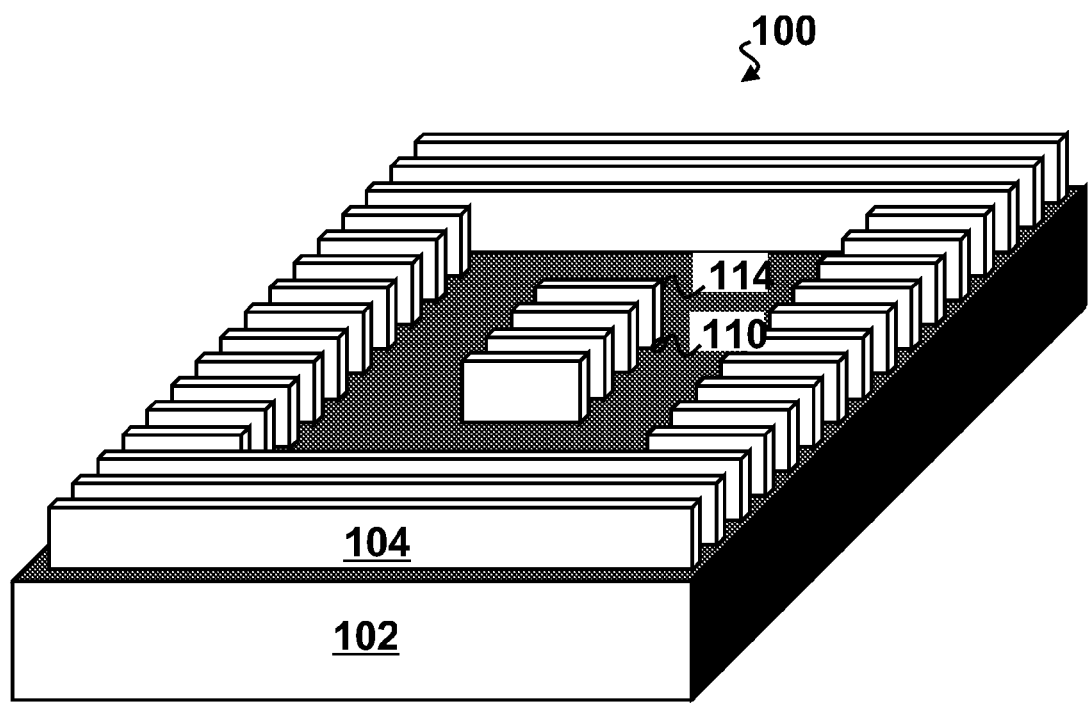
FIG. 1 is a perspective view of an overlay mark according to aspects of the present disclosure.

The present disclosure relates generally to an overlay mark for IC device manufacturing and more particularly, to an overlay mark suitable for nonplanar device manufacturing and to a method for creating the overlay mark.

The following disclosure provides many different embodiments, or examples, to illustrate the concepts herein. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a perspective view of an overlay mark 100 according to aspects of the present disclosure. FIG. 1 has been simplified for the sake of clarity. The illustrated overlay mark 100 embodies a number of different types of overlay marks. In some embodiments, the overlay mark 100 is an advanced image metrology (AIM) overlay mark. In some embodiments, the overlay mark 100 is typical of a box-in-box (BIB) overlay mark. The overlay mark 100 includes an array of overlay fins 104 formed on a substrate 102. The composition of both the substrate 102 and the overlay fins 104 will be described in detail later along with methods of forming the overlay fins 104.

When observed by an overlay metrology system, the border between the overlay fins 104 and the exposed substrate 102 provides a reference location for measuring the alignment of other mask patterns. An example of such a reference location is reference location 110 of FIG. 1. To accurately measure the alignment, the overlay metrology system must recognize a contrast between the overlay fins 104 and the substrate 102 at the reference location. In some applications, embodiments utilizing overlay fins 104 provide greater contrast with the substrate 102 than overlay marks utilizing other topographies such as a plateau. In this way, fins allow for rapid identification and accurate measurement. In an embodiment, the fin pitch is less than a minimum resolvable distance that can be resolved by the overlay metrology system. This sub-resolution fin density may prevent the system from measuring incorrect reference locations such as the exposed substrate between the overlay fins 104 and assist the overlay metrology system in locating correct reference locations such as reference location 110. This may further improve speed and accuracy.

In addition to providing greater contrast, in some embodiments, overlay fins 104 provide additional advantages over traditional overlay mark designs. For example, in some embodiments, fins prove resilient to manufacturing processes that tend to distort plateau-based overlay marks. In one such embodiment a hard mask loading factor affects the linearity of a plateau edge, whereas fins may prove less susceptible because fins tend to have smaller uninterrupted regions of mask material than plateaus. In another such embodiment, a substrate is exposed to annealing processes that distorts a plateau edge. In contrast, fins and particularly the line-end regions 114 of the fins may prove to be more resilient and remain true throughout annealing. In these and other embodiments, overlay marks incorporating fins may maintain a better profile.

While overlay fins 104 may prove more resilient and more accurate than traditional overlay features, in some applications, an overlay fin 104 may still exhibit sensitivity to certain processes. This can result in warping and bowing of the fin 104 along its longitudinal axis and/or wilting along its vertical axis. In an embodiment, overlay fins 104 are oriented to have line-end regions 114 along more than one axis. By forming an overlay mark from fins 104 with substantially perpendicular orientations, the durable fin line-end regions 114 can be used to take measurements along additional fin/substrate borders.

Figure 2:
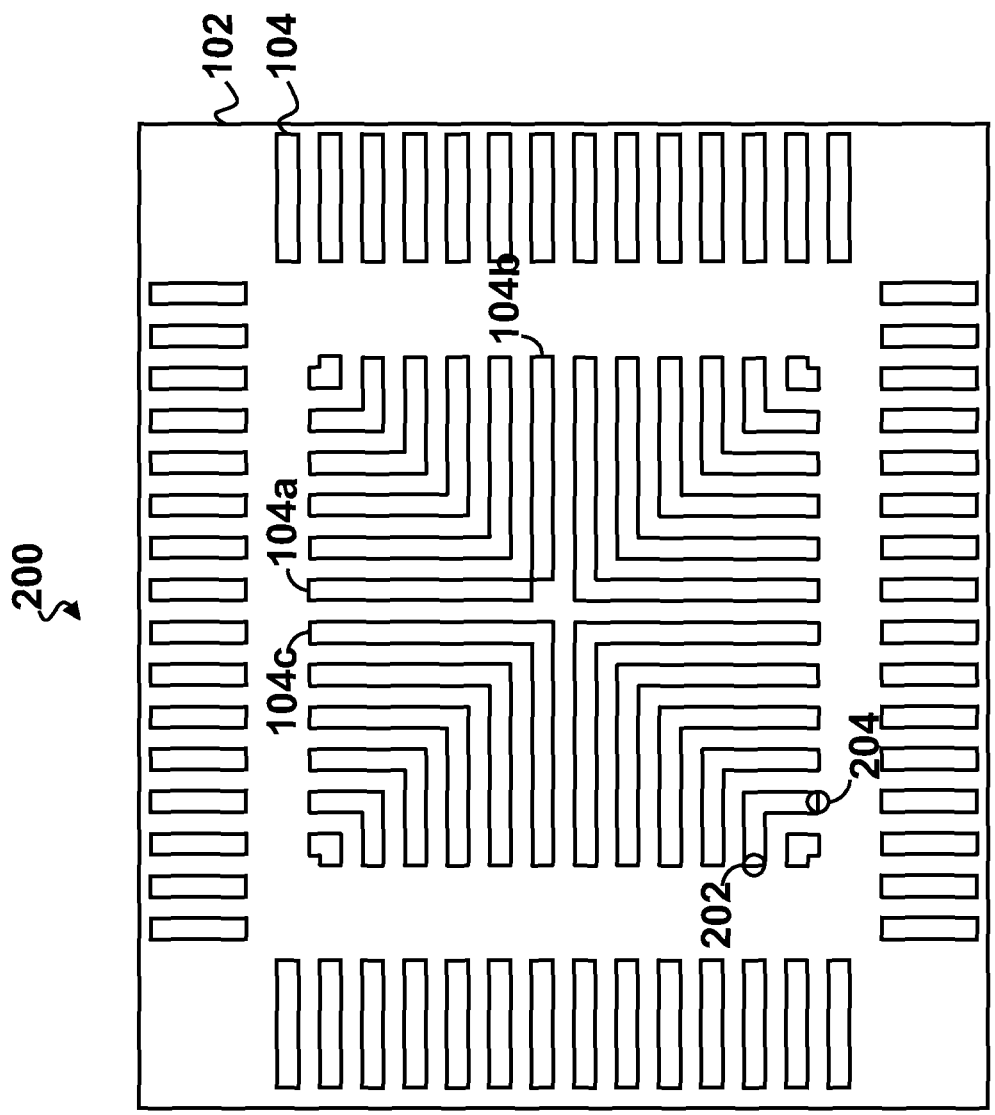
FIG. 2 is a top view of an overlay mark with two-axis segmentation according to aspects of the present disclosure.

FIG. 2 is a top view of an overlay mark 200 with two-axis segmentation according to aspects of the present disclosure. FIG. 2 has been simplified for the sake of clarity. The illustrated overlay mark 200 is typical of a BIB overlay mark, although it is understood to embody a number of different overlay marks including an AIM overlay mark. In an embodiment, the overlay fins 104 are arranged to have line-ends along a first and a second axis. In some such embodiments, this is done by creating sets of substantially perpendicular overlay fins. For example, overlay fin 104a has a length along a first axis and a corresponding overlay fin 104b has a length along a second axis. In another embodiment, a single overlay fin 104c has a length along both axes. In a further embodiment, the overlay mark 200 includes a combination of single-axis fin pairs and fins with lengths along both axes. One skilled in the art will recognize that the overlay mark 200 provides fin line-ends along multiple fin/substrate borders. For example, an overlay measurement can be taken at reference point 202 and at reference point 204. Because of the configuration of the overlay fins, both measurements may be made against fin line-ends.

Figure 3:
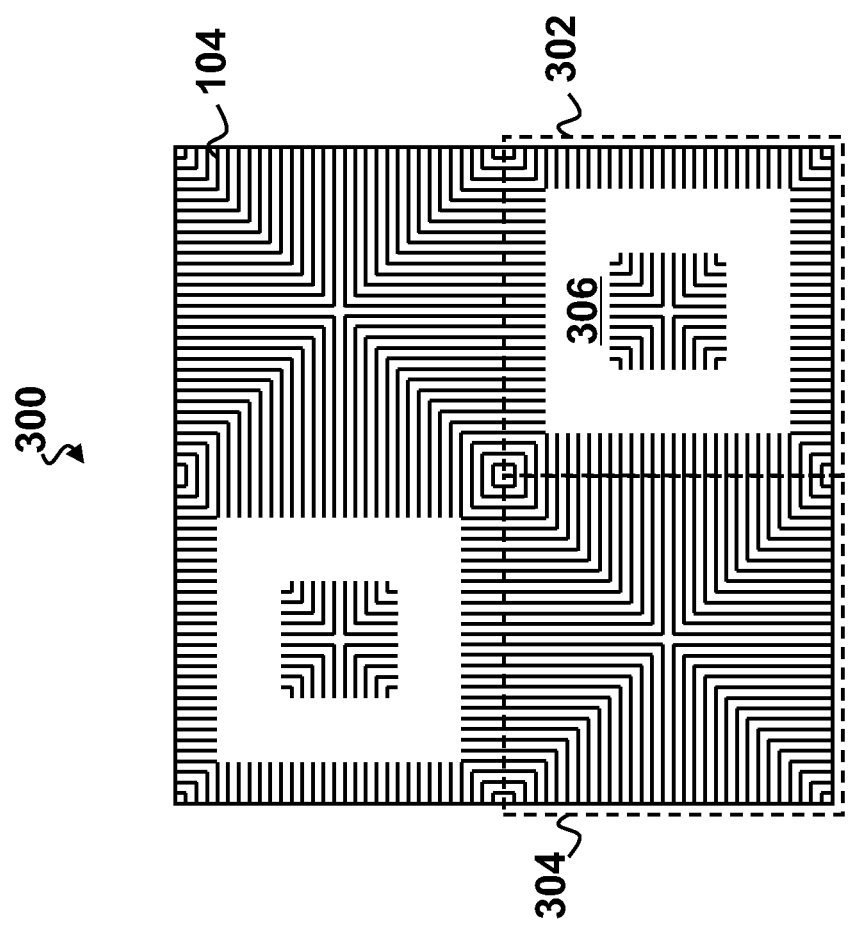
FIG. 3 is a top view of an overlay mark region according to aspects of the disclosure.
Figure 4:
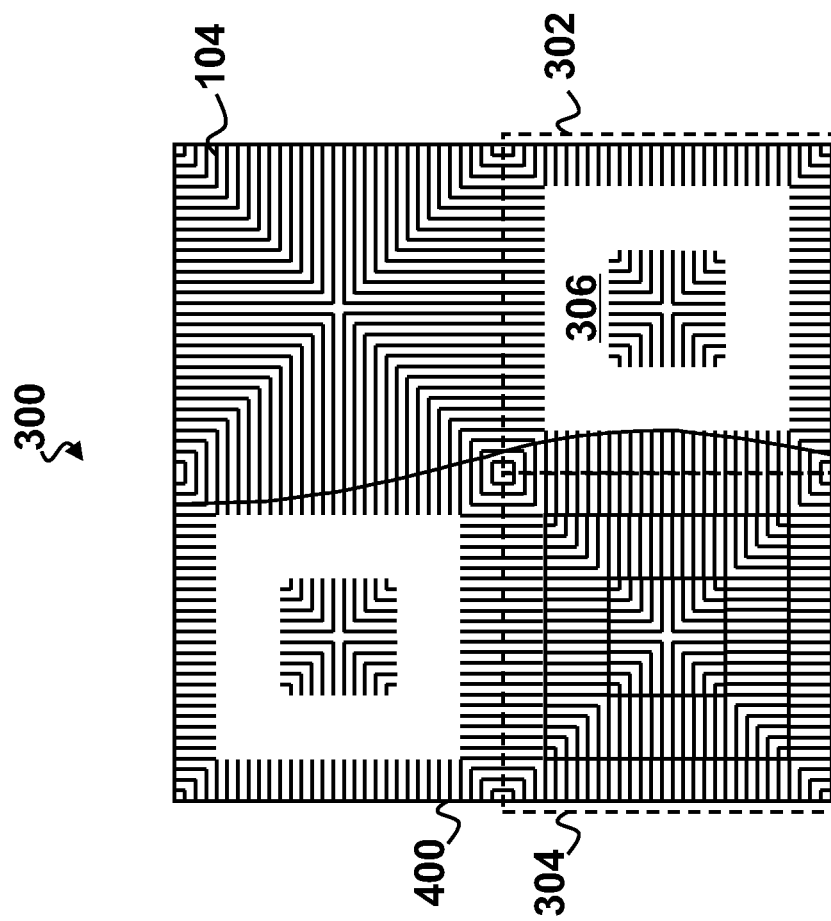
FIG. 4 is a partially cut-away top view of an overlay mark region according to aspects of the disclosure.
Figure 5:
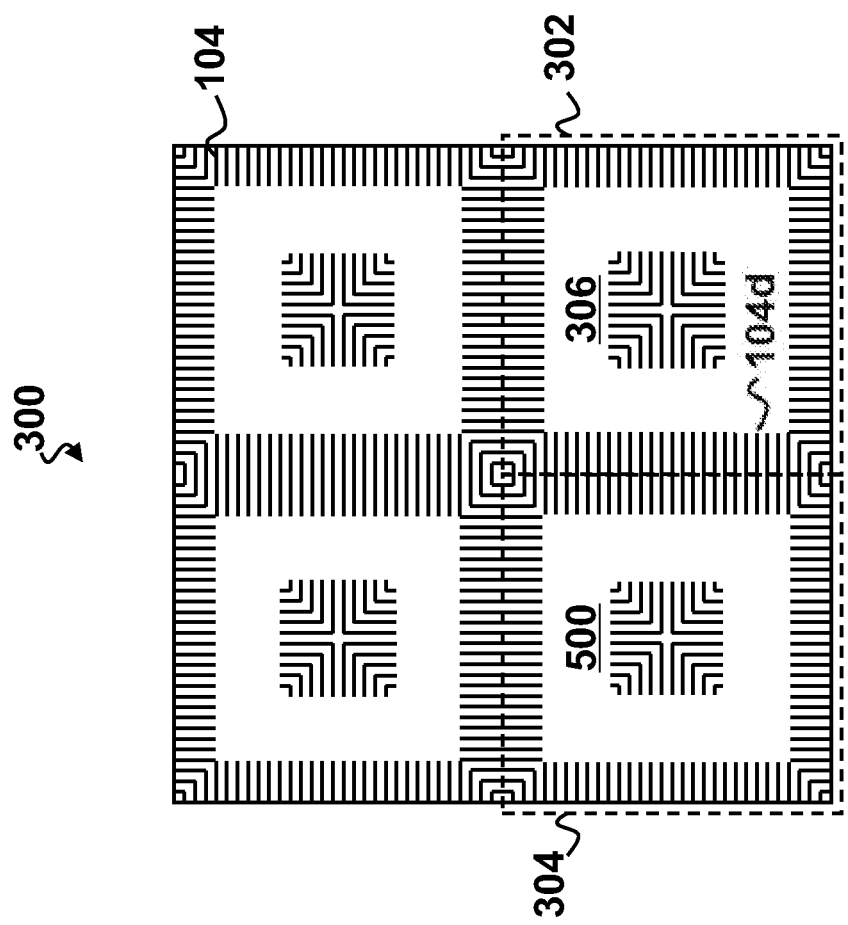
FIG. 5 is a top view of an overlay mark region according to aspects of the disclosure.

FIGS. 3 and 5 are top views of an overlay mark region 300 according to aspects of the disclosure. FIG. 4 is a partially cut-away top view of the overlay mark region 300 according to aspects of the disclosure. FIGS. 3, 4, and 5 have been simplified for the sake of clarity. In some embodiments, it is beneficial to form an overlay mark in a fin material. For example, an associated etching process may remove fin material better than substrate material and thereby dictate that fin material is the optimal medium for an overlay mark. For this reason as well as others, overlay fins 104 may be extended from a first overlay mark region into a second overlay mark region as illustrated in FIGS. 3-5 rather than forming two discrete sets of fins. In the illustrated embodiment, the fins 104 have two-axis line-ends. In further embodiments, the overlay fins 104 have line-ends along a first axis exclusively.

Referring to FIG. 3, in some embodiments, overlay fins 104 are extended beyond a first overlay mark region 302 designated for a first overlay mark 306 and into a region 304 designated for a second overlay mark. The first and second overlay marks may have different composition and structure and thus correspond to different layers, features, and/or processes.

Referring to FIG. 4, a mask 400 (shown partially cut-away) is formed and patterned as part of a process step in forming active devices on the substrate 102. As layers are formed and shaped to create active devices, corresponding processes may be applied to the overlay marks. Thus, the mask 400 material may be patterned to form an active device and an overlay mark. In some embodiments, the design methodology and/or the nature of the associated processing steps dictates whether the overlay mark is formed in the first region 302, the second region 304, or both. In the illustrated embodiment, the mask 400 is patterned to form an overlay mark in the second region 304.

Referring to FIG. 5, an etching process removes the fin material, thus forming a second overlay mark 500 in the second region 304. In some embodiments, although the first and second overlay marks (306 and 500) are not contiguous, one or more overlay fins (e.g., overlay fin 104d) extend from the first overlay mark region 302 to the second overlay mark region 304. In some embodiments, although the overlay marks are not contiguous, one or more overlay fins (e.g., overlay fin 104d) have a line end that defines a reference location of the first overlay mark 306 and a line end that defines a reference location of the second overlay mark 500.

The foregoing is merely one example of an application and an associated benefit. Further embodiments are contemplated extending or forming overlay fins 104 beyond a first overlay mark region 302 and into a second overlay region 304 to facilitate processing steps other than etching and for design purposes other than transferring a mask pattern.

One skilled in the art will recognize that the overlay marks of this disclosure provide reliable and accurate reference points for overlay metrology analysis with high contrast and resistance to deformation during processing. It is understood that different embodiments can offer different advantages and that no particular advantage is required for any one embodiment.

In some embodiments, it is advantageous to form overlay fins 104 using only processing steps already in place for forming active devices. For example, in a method for manufacturing a nonplanar circuit device such as a FinFET, the overlay fins 104 may be formed concurrently with fins corresponding to the circuit device. Such active device fins may include the elevated source/drain region of the nonplanar circuit device.

Figure 6:
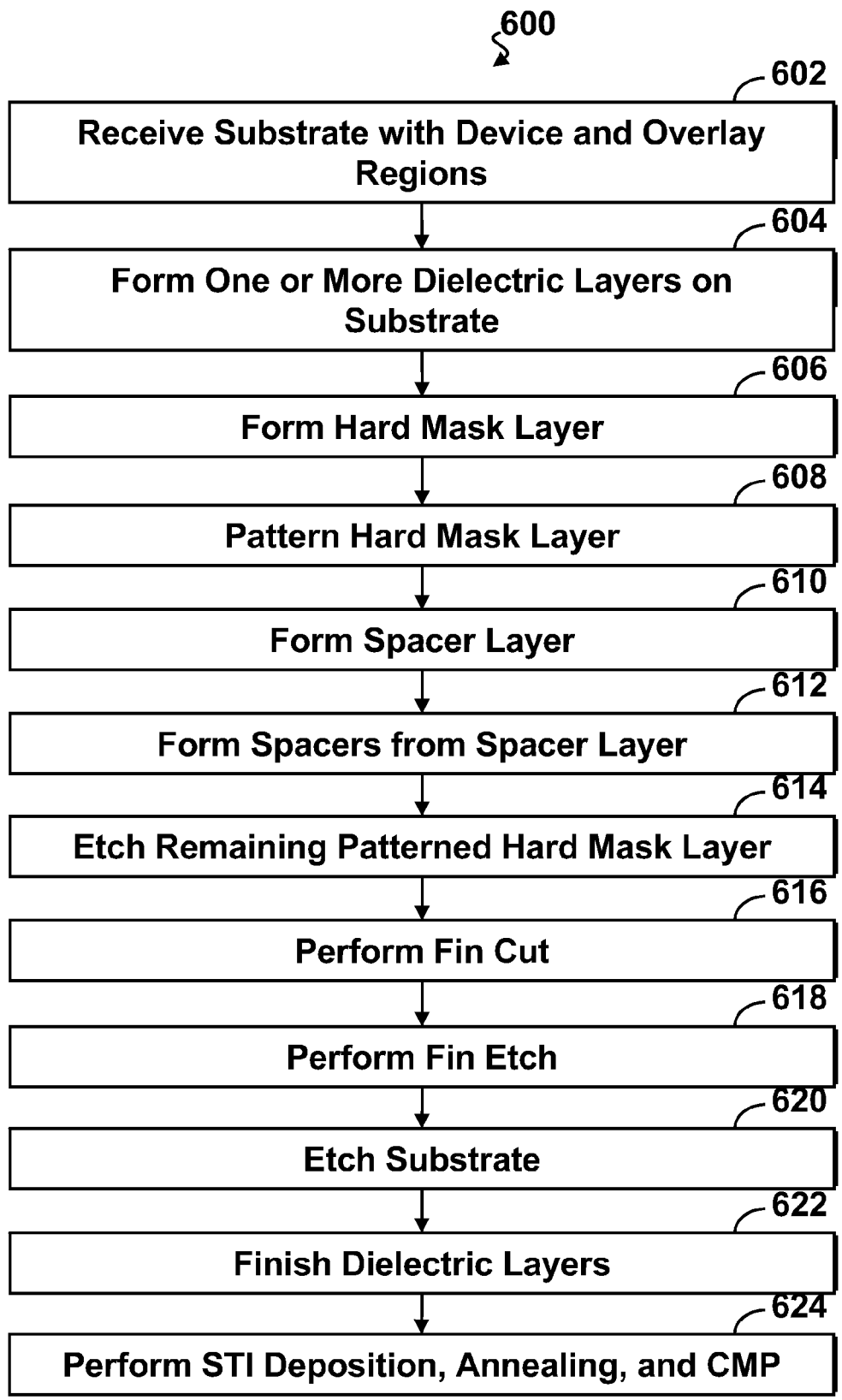
FIG. 6 is a flow diagram of a method for forming overlay fins and active device fins according to aspects of the present disclosure.
Figure 12:
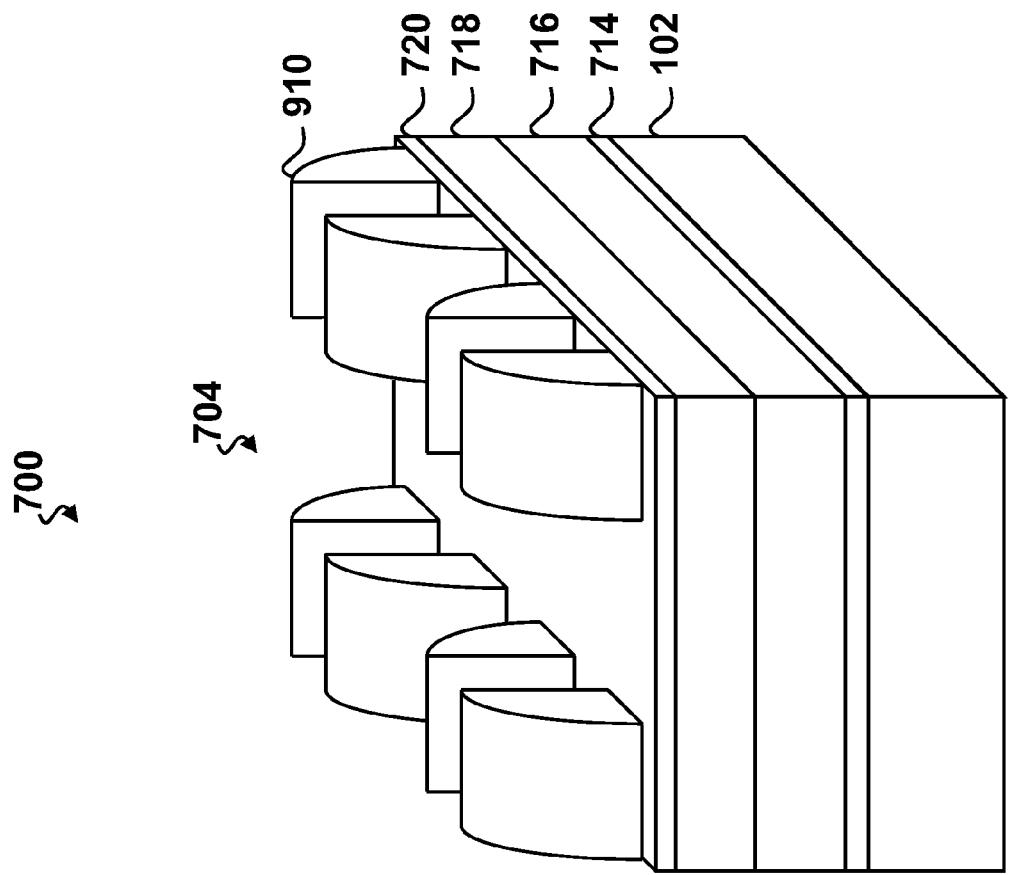
FIG. 12 is a perspective view of an overlay region of an IC precursor undergoing a method of forming overlay fins and active device fins according to aspects of the present disclosure.

A method 600 for forming overlay fins 104 and active device fins on an IC precursor 700 is described with reference made to FIGS. 6-15. FIG. 6 is a flow diagram of the method 600 for forming overlay fins 104 and active device fins according to aspects of the present disclosure. It is understood that additional steps can be provided before, during, and after the method 600, and some of the steps described can be replaced or eliminated for other embodiments of the method. FIGS. 7-11 and FIGS. 13-15 are sectional views of an IC precursor undergoing the method 600 of forming overlay fins and active device fins according to aspects of the present disclosure. FIG. 12 is a perspective view of an overlay region of an IC precursor undergoing the method 600 of forming overlay fins and active device fins according to aspects of the present disclosure.

Figure 7:
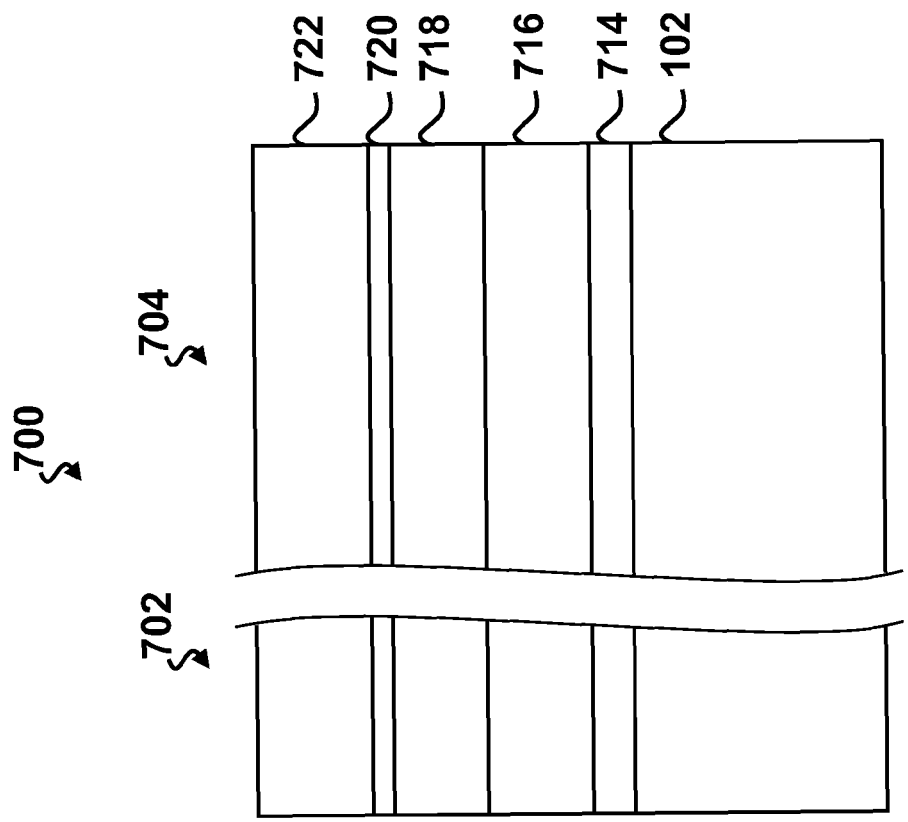

Referring to FIG. 7, the method 600 begins at block 602 where an IC FinFET precursor 700 including a substrate 102 is received. The substrate 102 may be a wafer, a semiconductor substrate, or any base material on which processing is conducted to produce layers of material, pattern features, and/or integrated circuits. The substrate 102 may be a bulk silicon substrate. Alternatively, the substrate 102 may comprise an elementary semiconductor, such as silicon or germanium in a crystalline structure; a compound semiconductor, such as silicon germanium, silicon carbide, gallium arsenic, gallium phosphide, indium phosphide, indium arsenide, indium antimonide, and/or combinations thereof. Possible substrates 102 also include a silicon-on-insulator (SOI) substrate. SOI substrates are fabricated using separation by implantation of oxygen (SIMOX), wafer bonding, and/or other suitable methods.

Some exemplary substrates 102 include an insulator layer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary substrates 102, the insulator layer is a component (e.g., layer) of a silicon-on-insulator substrate.

The substrate 102 contains an active device region 702 for forming active devices and contains an overlay region 704 for forming overlay marks. In some embodiments, the overlay region 704 is contained within a frame area around the active device region 702.

The substrate 102 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 102, in a P-well structure, in an N-well structure, in a dual-well structure, or using a raised structure. The semiconductor substrate 102 may further include various active regions, such as regions configured for an N-type metal-oxide-semiconductor transistor device and regions configured for a P-type metal-oxide-semiconductor transistor device.

In block 604, one or more dielectric layers may be formed on the substrate 102. Referring still to FIG. 7, in an exemplary embodiment, the dielectric layers include an interfacial layer 714, a first intermediate dielectric layer 716, a second intermediate dielectric layer 718, and a capping layer 720. Materials for the dielectric layers may be selected based on a number of criteria. For example, the materials may be selected based on an associated etchant. Particularly in, but not limited to, embodiments where a dielectric layer is etched without etching adjacent layers, such as when an adjacent layer is used as a mask to guide the etching, materials are selected accordingly. Buffered hydrofluoric acid etches silicon oxide at a considerably higher rate than silicon nitride. Alternately, phosphoric acid selectively etches silicon nitride at a higher rate than silicon oxide. For the purposes of this disclosure, etching includes ashing processes. Ashing removable dielectrics (ARDs) are more sensitive to ashing processes (e.g. $O_2$ ashing, $N_2$ ashing, or $H_2$ ashing) than other potential dielectrics. Thus, a dielectric layer may include an ARD.

Materials for the dielectric layers may also be selected based on dielectric constant, and may be classified as traditional dielectrics, high-k dielectric materials, low-K (LK), extreme low-K (ELK), and/or extra low-k (XLK) materials. It is understood that the classifications are mere examples and that other classifications based on the dielectric constant of the material are contemplated and may be utilized as well. Traditional dielectrics include silicon oxide, silicon nitride, silicon oxynitride, and/or combinations thereof. Examples of high-k dielectric material include $HfO_2$, HfSiO, HfSiON, HfTaO, HfSiO, HfZrO, zirconium oxide, aluminum oxide, hafnium dioxide-alumina ($HfO_2$—$Al_2O_3$) alloy, and/or combinations thereof. LK, ELK, and/or XLK dielectric materials include materials such as silicon nitride, silicon oxynitride, spin-on glass (SOG), undoped silicate glass (USG), fluorinated silica glass (FSG), carbon doped silicon oxide (e.g., SiCOH), carbon-containing material, Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical of Midland, Mich.), polyimide, other suitable dielectric materials, and/or combinations thereof.

Materials for the dielectric layers may be selected based on any other suitable design criteria, examples of which include the material's structural characteristics and/or etching profile. In an exemplary embodiment, the interfacial layer 714 includes silicon oxide, the first intermediate dielectric layer 716 includes silicon nitride, the second intermediate dielectric layer 718 includes an ARD, and the capping layer 720 includes silicon nitride.

The dielectric layers including the interfacial layer 714, the first intermediate dielectric layer 716, the second intermediate dielectric layer 718, and the capping layer 720 are formed by any suitable technique including spin-on, physical vapor deposition (PVD), chemical vapor deposition (CVD), high density plasma CVD (HDP-CVD), and atomic layer deposition (ALD) and may be formed to any suitable depth.

Referring to FIG. 7 and block 606, a hard mask layer 722 is formed on the substrate 102. The hard mask layer 722 is formed of any suitable material, examples of which include silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP)

formed oxide, other suitable material, and/or combination thereof. In an embodiment, the hard mask layer is a multiple layer film.

Figure 8:
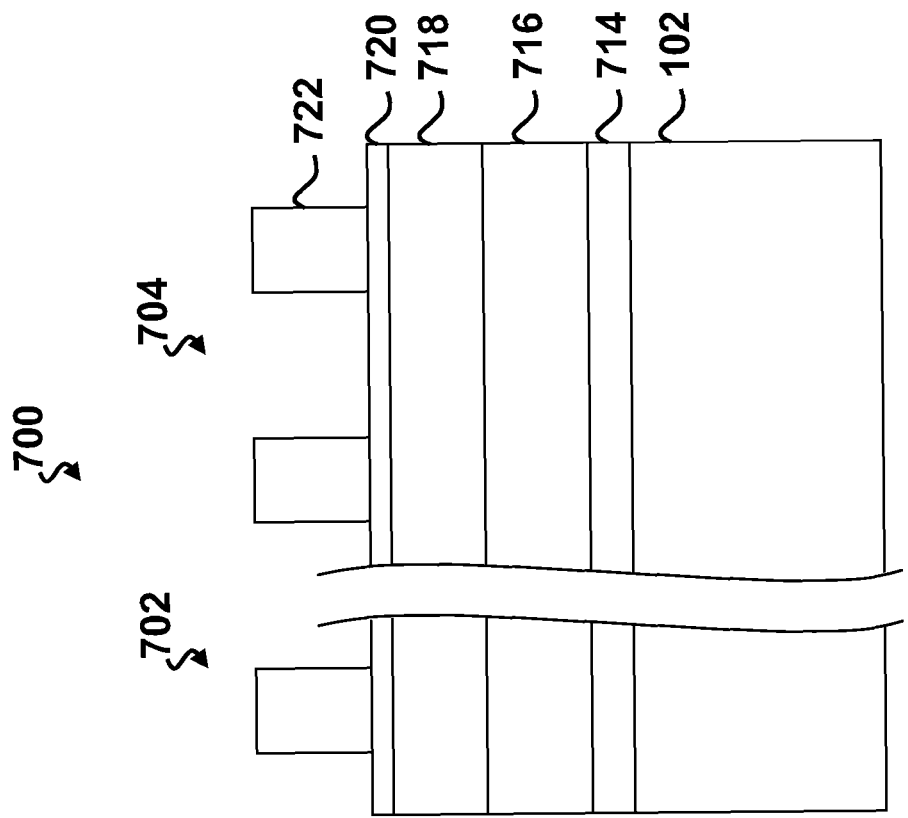

Referring to FIG. 8, in block 608, the hard mask layer 722 is patterned. In an embodiment, the hard mask layer 722 is patterned using a photolithographic patterning process. The photolithographic processes may include photoresist coating (e.g., spin-on coating), soft baking, mask aligning, exposure, post-exposure baking, developing the photoresist, rinsing, drying (e.g., hard baking), and etching the hard mask layer 722 using the exposed and developed photoresist. Suitable etching processes include dry etching, wet etching, and/or other etching methods (e.g., reactive ion etching). Alternatively, the photolithographic process may be implemented, supplemented, or replaced by other methods such as maskless photolithography, electron-beam writing, and ion-beam writing. Patterning the hard mask layer 722 begins the process of defining the overlay fins 104. In some embodiments, the hard mask layer 722 is patterned to produce overlay fins 104 having longitudinal bodies along a first axis and overlay fins 104 having longitudinal bodies along a second axis. In some embodiments, the hard mask layer 722 is patterned to produce overlay fins 104 each having a first longitudinal body directed along a first axis and a second longitudinal body directed along a second axis. In some embodiments, the hard mask layer 722 is patterned to produce an overlay fin pitch less than a minimum resolvable distance of an overlay metrology system. In some embodiments, the hard mask layer is patterned to produce overlay fins 104 within the overlay region 704 and active device fins within the active device region 702.

Referring to FIG. 9, in block 610, a spacer layer 900 is deposited on the patterned hard mask layer 722. In an embodiment, the spacer layer 900 comprises a dielectric material, such as silicon oxide, silicon nitride, silicon oxynitride, other suitable materials, and/or combinations thereof. In some embodiments, the spacer layer 900 dielectric is selected to have a different etch sensitivity from the hard mask layer 722. In further embodiments, the dielectric material is selected based a sensitivity to an anisotropic etchant. The spacer layer 900 may be deposited by thermal deposition, atomic layer deposition, plasma-enhanced chemical vapor deposition, other processes known to one of skill in the art, and/or combinations thereof. The spacer layer 900 is applied in such a manner as to form spacers 910 adjacent to features of the hard mask layer 722. In such embodiments, the deposition of the spacer layer 900 is adapted to control the thickness of the spacers 910.

Referring to FIG. 10, in block 612, an etching is performed to remove portions of the spacer layer 900. In an embodiment, an anisotropic etch is performed to remove areas of the spacer layer 900 not corresponding to the spacers 910. Anisotropic etching is orientation dependent and may be used to directionally etch the spacer layer 900. An exemplary anisotropic etching is performed using $CH_2O_2$. Other anisotropic etchants include TMAH, KOH, and EDP (ethylene diamine and pyrocatechol). Dry etching may also be performed anisotropically using such mechanisms as DRIE (deep reactive-ion etching).

Figure 11:
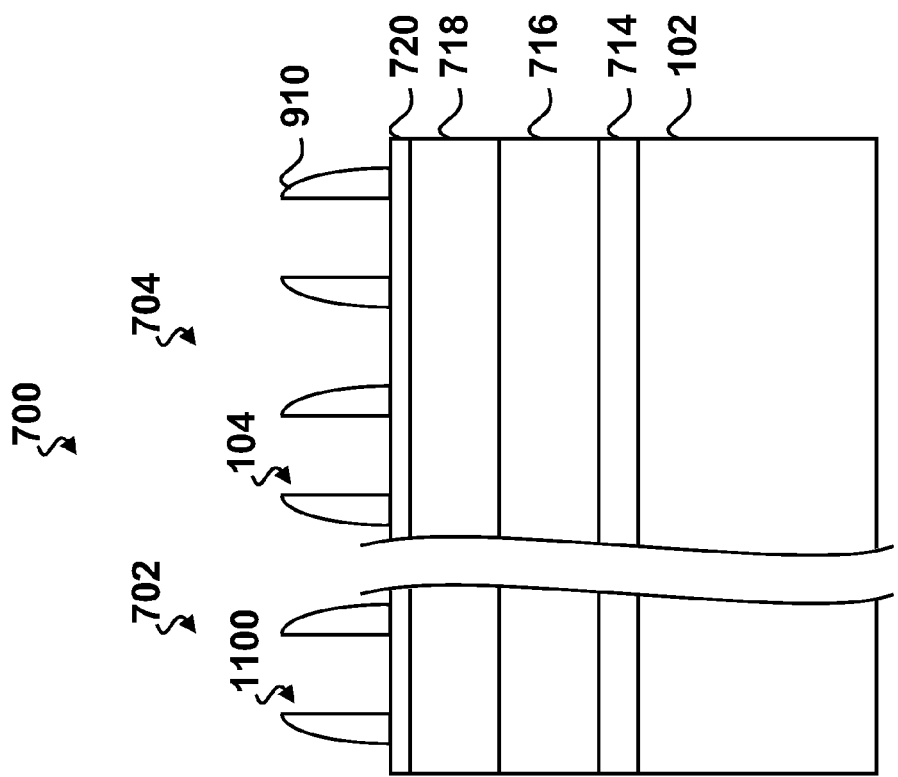

Referring to FIG. 11, in block 614 an etching is performed to further etch the hard mask layer 722. In order to leave the spacers 910 unetched, a selective etchant may be used. In some embodiments, the hard mask layer 722 includes silicon nitride, and the spacer layer 900 includes silicon oxide. In one such embodiment, phosphoric acid is used to etch the hard mask layer 722 without disturbing the spacers 910. In some embodiments, buffered hydrofluoric acid is used to etch a silicon oxide hard mask layer 722 but leave a silicon nitride spacer 910. Sacrificial shapes such as the features of the hard mask layer 722 are often called mandrels. For this reason, this etching process may be referred to as a mandrel etch. As can be seen in FIG. 11, initial elements of the overlay fins 104 can be identified, along with initial elements of an active device fin 1100.

Referring to FIG. 12, in block 616, the overlay fins 104 are cut, for example, to define the trench of an overlay mark. In the illustrated embodiment, the fin 104 shapes are cut transversely. In a further embodiment, the cut process divides the fins 104 along a direction other than the transverse axis. In a further embodiment, the cut process removes fins 104 completely. In yet a further embodiment, the cut process divides fins along a transverse axis, divides fins at a direction other than the transverse axis, and removes fins. The cut process may be configured to form fins 104 having line ends along a first axis, along a second axis substantially perpendicular to the first axis, or along both the first and second axis.

The cut process may be performed using any suitable etching process. In an embodiment, a photomask is applied to the substrate. The photomask is patterned via a photolithographic exposure and developed to expose the area containing the spacers 910 that are to be removed. An etching process is then used to remove or cut the designated spacer material. In an alternate embodiment, the etching process is used to remove or cut the designated spacer material and underlying dielectric layers.

Referring to FIG. 13 and block 618, a fin etch is performed to transfer the fin shapes to the dielectric layers such as the interfacial layer 714, the first intermediate dielectric layer 716, the second intermediate dielectric layer 718, and the capping layer 720. The fin etch may include multiple distinct etching processes targeting a particular layer. Each etching process may use an adjacent layer as a mask to define the area to be etched. Layers no longer required for masking may be etched away in the course of etching a separate dielectric layer. In an embodiment, a silicon oxide spacer 910 is used to mask regions of the silicon nitride capping layer 720 during etching. A selective etchant such as phosphoric acid is used to etch exposed portions of the capping layer 720. In the exemplary embodiment, the fin etching process continues by using the spacer 910 and the capping layer 720 to mask the etching of a second intermediate dielectric layer 718 containing an ARD. An ashing process takes advantage of the ARD's sensitivity and removes only the exposed areas of the second intermediate dielectric layer 718. The embodiment continues with another etching process using phosphoric acid to etch a silicon nitride first intermediate dielectric layer 716 using the spacer 910, the capping layer 720, and/or the second intermediate dielectric layer 718 to define regions of the first intermediate dielectric layer 716 to be etched. This etchant may undercut the silicon nitride of the capping layer 720 removing the capping layer 720 and the spacer 910. However, the second intermediate dielectric layer 718 still functions as a suitable mask. The embodiment continues with a selective etching of a silicon oxide interfacial layer 714 using buffered hydrofluoric acid and using the spacers and/or the other dielectric layers as masks. This etching may also etch unused masking layers such as, in the current embodiment, a silicon oxide spacer 910. In various other embodiment, the fin etch includes other etching processes such as a wet etching processes, a dry etching processes, and/or combinations thereof. The etching processes may also use a reactive ion etch (RIE) and/or other suitable process.

Referring to FIG. 14 and block 620, the substrate 102 may be etched to form elevated substrate regions 1400. In an embodiment, remaining dielectric layers are used to pattern the substrate 102. The etching may use any suitable etching process including wet-etching, dry-etching, and/or RIE. In one example, a dry etching process used to etch the substrate 102 includes a fluorine-containing gas chemistry such as $CF_4$, $SF_6$, $NF_3$, or other suitable gas.

Referring to FIG. 15 and block 622, remaining dielectric layers may be removed. In various embodiments, the capping layer 720, the second intermediate dielectric layer 718, the first intermediate dielectric layer 716, and/or the interfacial layer 714 are removed. In some embodiments, the overlay fin 104 is defined by the elevated substrate region 1400 after the removal process. Removal of the dielectric layers may be performed using any suitable etching process including wet-etching, dry-etching, and/or RIE.

In block 624, remaining process steps for forming active IC devices are performed. In various embodiments, these include epitaxial growth processes to form elevated source/drain structures, implantation processes, depositions such as shallow trench isolation feature deposition, annealing processes, and chemical-mechanical planarization (CMP) processes.

Figure 16:
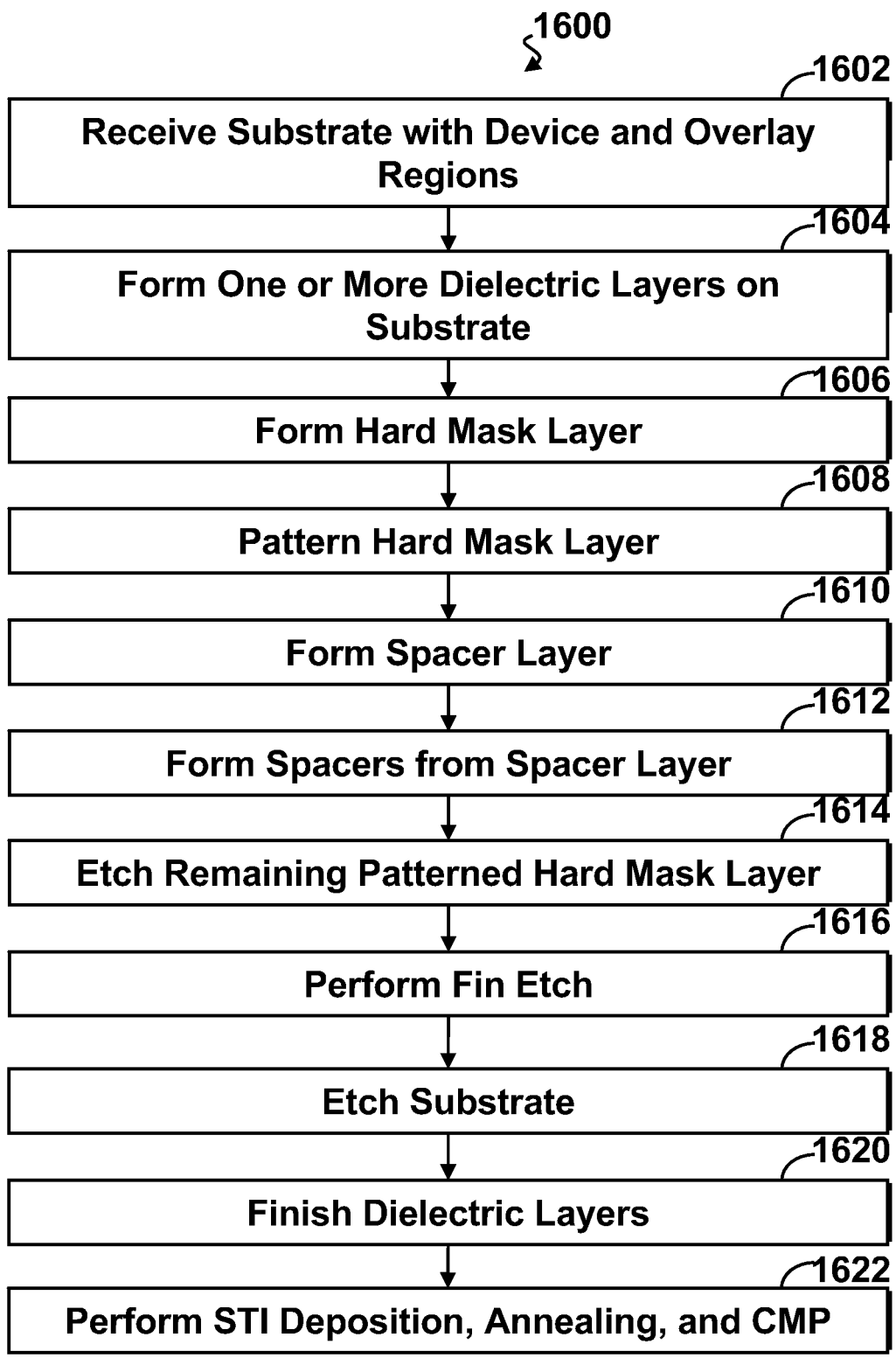
FIG. 16 is a flow diagram of a method for forming an overlay mark and an active device structure according to aspects of the present disclosure.

A method 1600 for forming an overlay mark and an active device structure on an IC precursor 700 is described with reference made to FIGS. 16-24. FIG. 16 is a flow diagram of the method 1600 for forming the overlay mark and the active device structure according to aspects of the present disclosure. It is understood that additional steps can be provided before, during, and after the method 1600, and some of the steps described can be replaced or eliminated for other embodiments of the method. FIGS. 17 and 19-24 are sectional views of an IC precursor undergoing the method 1600 of forming the overlay mark and the active device structure according to aspects of the present disclosure. FIG. 18 is a perspective view of an overlay region of an IC precursor undergoing the method 1600 of forming the overlay mark and the active device structure according to aspects of the present disclosure.

Referring to FIG. 17, the method 1600 begins at block 1602 where an IC FinFET precursor 700 including a substrate 102 is received. The substrate may be a wafer, a semiconductor substrate, or any base material on which processing is conducted to produce layers of material, pattern features, and/or integrated circuits. The substrate 102 contains a device region 702 and an overlay mark region 704.

In block 1604, one or more dielectric layers are formed on the substrate 102. In some embodiments, dielectric layers include an interfacial layer 714, a first intermediate dielectric layer 716, a second intermediate dielectric layer 718, and/or a capping layer 720. The dielectric layers are formed by any suitable technique including spin-on, physical vapor deposition (PVD), chemical vapor deposition (CVD), high-density plasma CVD (HDP-CVD), and atomic layer deposition (ALD) and may be formed to any suitable depth. Referring to FIG. 17 and block 1606, a hard mask layer 722 is formed on the substrate 102. The hard mask layer 722 is formed of any suitable material, examples of which include silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, other suitable material, and/or combination thereof. In an embodiment, the hard mask layer is a multiple layer film.

Referring to FIG. 18, in block 1608, the hard mask layer 722 is patterned. In an embodiment, the hard mask layer 722 is patterned using a photolithographic patterning process. The photolithographic processes may include photoresist coating (e.g., spin-on coating), soft baking, mask aligning, exposure, post-exposure baking, developing the photoresist, rinsing, drying (e.g., hard baking), and etching the hard mask layer 722 using the exposed and developed photoresist. Suitable etching processes include dry etching, wet etching, and/or other etching methods (e.g., reactive ion etching). Alternatively, the photolithographic process may be implemented, supplemented, or replaced by other methods such as maskless photolithography, electron-beam writing, and ion-beam writing.

Patterning the hard mask layer 722 begins the process of defining the overlay fins 104. In some embodiments, the hard mask layer 722 is patterned to produce overlay fins 104 having longitudinal bodies along a first axis and overlay fins 104 having longitudinal bodies along a second axis. In some embodiments, the hard mask layer 722 is patterned to produce overlay fins 104 each having a first longitudinal body directed along a first axis and a second longitudinal body directed along a second axis. In some embodiments, the hard mask layer 722 is patterned to produce an overlay fin pitch less than a minimum resolvable distance of an overlay metrology system. In some embodiments, the hard mask layer is patterned to produce overlay fins 104 within the overlay region 704 and active device fins within the active device region 702. In some embodiments, the hard mask layer 722 is patterned to define a trench 1800 transverse to the longitudinal body of one or more overlay fins 104. The trench may eventually form a reference location 110 defined by a fin line-end. In some such embodiments, the trench 1800 is defined within a database used to pattern the mask layer 722. For example, the trench 1800 may be characterized by a drawing shape in a design database. In some embodiments, patterning the hard mask layer 722 forms one or more trenches 1800 resulting in fin line-ends along a first axis, along a second axis substantially perpendicular to the first axis, or along two substantially perpendicular axes.

Figure 19:
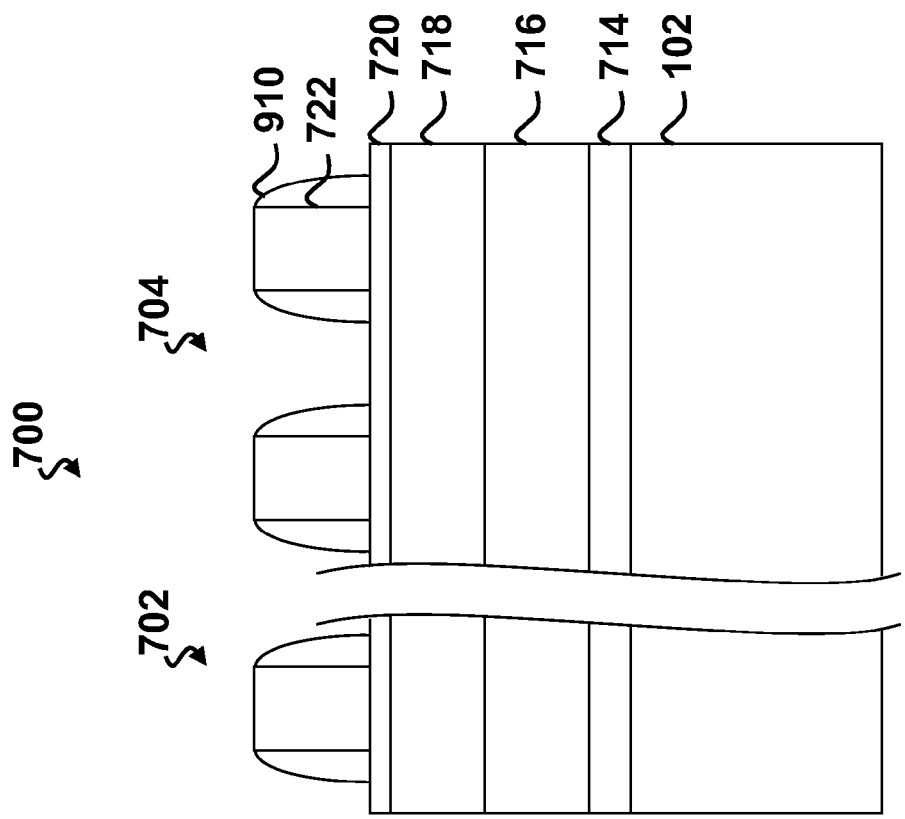

Referring to FIG. 19, in block 1610, a spacer layer 900 is deposited on the patterned hard mask layer 722. In an embodiment, the spacer layer 900 comprises a dielectric material, such as silicon oxide, silicon nitride, silicon oxynitride, other suitable materials, and/or combinations thereof. The spacer layer 900 may be deposited by thermal deposition, atomic layer deposition, plasma-enhanced chemical vapor deposition, other processes known to one of skill in the art, and/or combinations thereof. The spacer layer 900 is applied in such a manner as to form spacers 910 adjacent to features of the hard mask layer 722.

Figure 20:
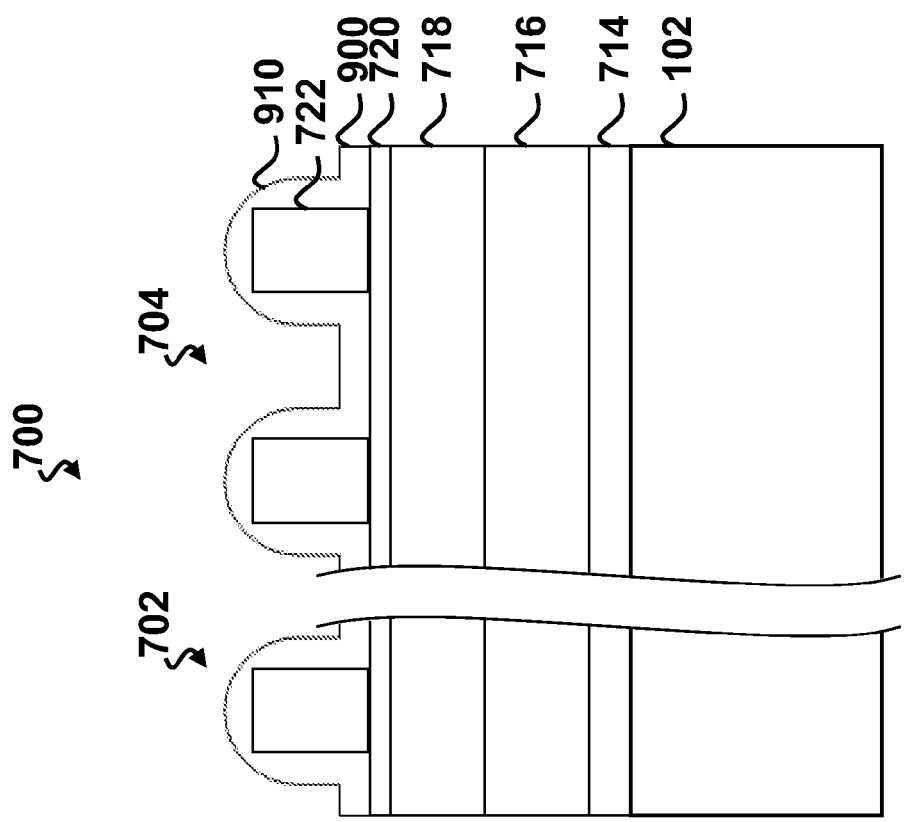

Referring to FIG. 20, in block 1612, an etching is performed to remove portions of the spacer layer 900. In an embodiment, an anisotropic etch is performed to remove areas of the spacer layer 900 not corresponding to the spacers 910. In various exemplary embodiments, anisotropic etching is performed using $CH_2O_2$, TMAH, KOH, and/or EDP. Dry etching may also be performed anisotropically using such mechanisms as DRIE (deep reactive-ion etching).

Figure 21:
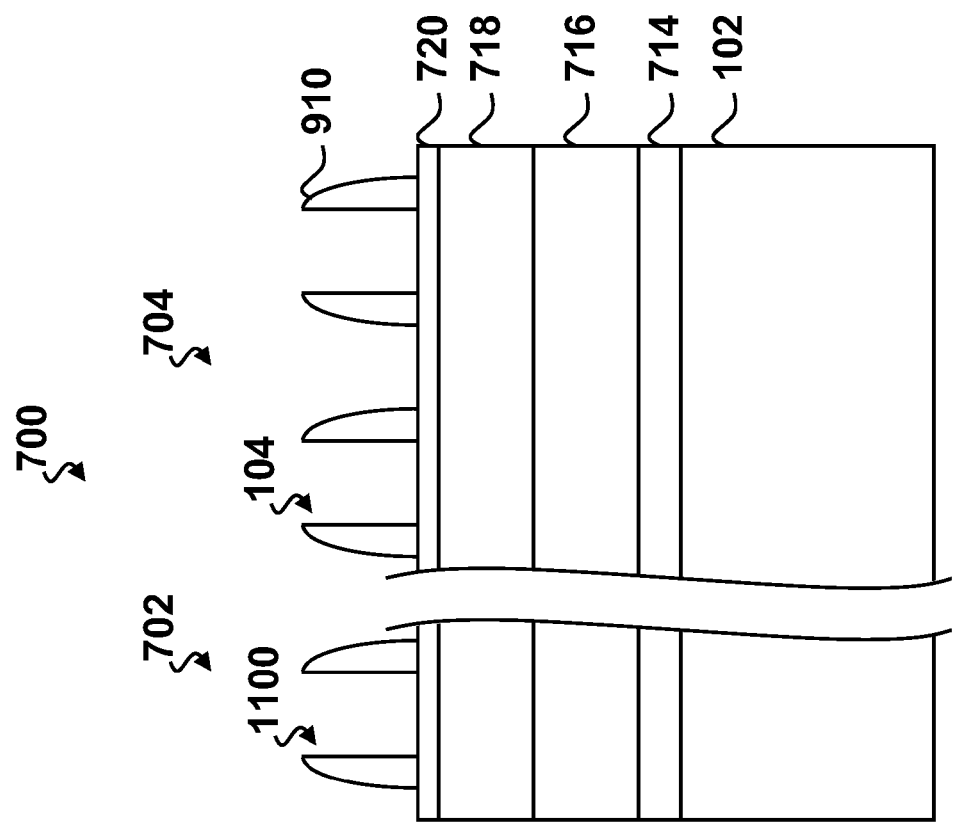

Referring to FIG. 21, in block 1614 an etching is performed to etch the hard mask layer 722. In order to leave the spacers 910 unetched, a selective etchant may be used. In the illustrated embodiment, the etching reveals initial elements of the overlay fins 104 along with initial elements of an active device fin 1100.

Figure 22:
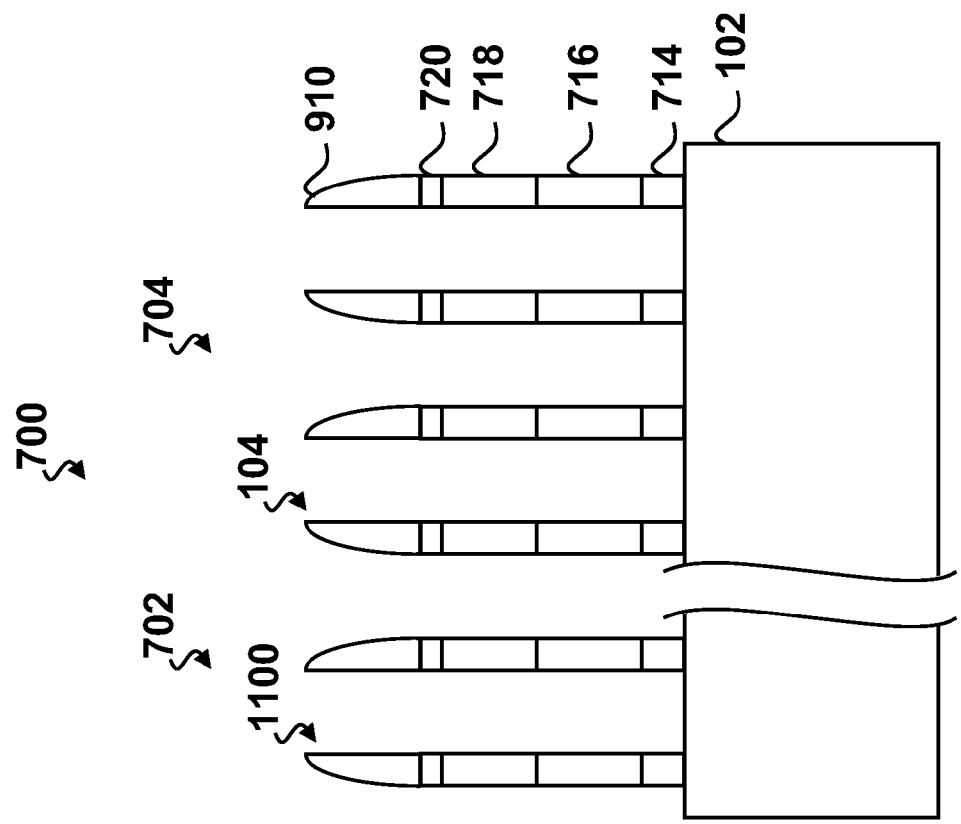

Referring to FIG. 22 and block 1616, a fin etch is performed to transfer the fin shapes to the dielectric layers such as the interfacial layer 714, the first intermediate dielectric layer 716, the second intermediate dielectric layer 718, and the capping layer 720. The fin etch may include multiple distinct etching processes each targeting a particular layer. An etching process may use an adjacent layer as a mask to define the area to be etched. Layers no longer required for masking may be etched away in the course of etching a separate dielectric layer. In various embodiments, the fin etch includes etching processes such as a wet etching processes, a dry etching processes, ashing and/or combinations thereof. The etching processes may also use a reactive ion etch (RIE) and/or other suitable process.

Referring to FIG. 23 and block 1618, the substrate 102 may be etched to form elevated substrate regions 1400. In an embodiment, remaining dielectric layers are used to pattern the substrate 102. The etching may use any suitable etching process including wet-etching, dry-etching, and/or RIE. In one example, a dry etching process used to etch the substrate 102 includes a fluorine-containing gas chemistry such as $CF_4$, $SF_6$, $NF_3$, or other suitable gas.

Referring to FIG. 24 and block 1620, remaining dielectric layers may be removed. In various embodiments, the capping layer 720, the second intermediate dielectric layer 718, the first intermediate dielectric layer 716, and/or the interfacial layer 714 are removed. In some embodiments, the overlay fin 104 is defined by the elevated substrate region 1400 after the removal process. Removal of the dielectric layers may be performed using any suitable etching process including wet-etching, dry-etching, and/or RIE.

In block 1622, remaining process steps for forming active IC devices are performed. In various embodiments, these include epitaxial growth processes to form elevated source/drain structures, implantation processes, depositions such as shallow trench isolation feature deposition, annealing processes, and chemical-mechanical planarization (CMP) processes.

Thus, the present disclosure provides an overlay mark suitable for nonplanar device manufacturing and a method for creating the overlay mark.

In one embodiment, the integrated circuit device comprises: a substrate having an active device region and an overlay mark region; and a plurality of fins disposed on the substrate within the overlay mark region, each fin of the plurality of fins including a longitudinal body and a fin line-end, wherein the fin line-end defines a reference location for mask overlay analysis to be performed by an overlay metrology system.

In a further embodiment, the method comprises: receiving a substrate having an overlay region; forming one or more dielectric layers on the substrate; forming a hard mask layer on the one or more dielectric layers; patterning the hard mask layer to form a hard mask layer feature, the hard mask layer feature configured to define an overlay mark fin disposed within the overlay region; forming a spacer on the patterned hard mask layer, the spacer further defining the overlay mark fin; cutting the overlay mark fin to form a fin line-end defining a reference location for mask overlay metrology; etching the one or more dielectric layers using the spacer, the etching of the dielectric layers further defining the overlay mark fin; and etching the substrate using the etched one or more dielectric layers, the etching of the substrate further defining the overlay mark fin.

In yet another embodiment, the method comprises: receiving a substrate having an active device region and an overlay mark region, the substrate further having one or more dielectric layers and a hard mask layer formed on the substrate; patterning the hard mask layer to form a hard mask layer feature defining an overlay mark fin, wherein the patterning further forms a hard mask layer trench configured to provide an overlay metrology reference location; forming a first spacer on the patterned hard mask layer, the first spacer further defining the overlay mark fin; etching the one or more dielectric layers using the first spacer, the etching of the dielectric layers further defining the overlay mark fin; and etching the substrate using the etched one or more dielectric layers, the etching of the substrate further defining the overlay mark fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving a substrate having an overlay region;
forming one or more dielectric layers on the substrate;
forming a hard mask layer on the one or more dielectric layers;
patterning the hard mask layer to form a hard mask layer feature, the hard mask layer feature configured to define an overlay mark fin disposed within the overlay region;
forming a spacer on the patterned hard mask layer, the spacer further defining the overlay mark fin;
cutting the overlay mark fin to form a fin line-end defining a reference location for mask overlay metrology;
etching the one or more dielectric layers using the spacer, the etching of the dielectric layers further defining the overlay mark fin; and
etching the substrate using the etched one or more dielectric layers, the etching of the substrate further defining the overlay mark fin.

2. The method of claim 1,
wherein the hard mask layer feature is a first hard mask layer feature and is configured to define a first overlay mark fin having a longitudinal body directed along a first axis; and
wherein patterning the hard mask layer further forms a second hard mask layer feature, the second hard mask layer feature configured to define a second overlay mark fin disposed within the overlay region and having a longitudinal body directed along a second axis substantially perpendicular to the first axis.

3. The method of claim 1, wherein the hard mask layer feature is configured to define the overlay mark fin having a longitudinal body directed along a first axis and having a second longitudinal body directed along a second axis substantially perpendicular to the first axis.

4. The method of claim 1, wherein the hard mask layer feature is configured to define a first overlay mark fin and a second overlay mark fin disposed at a distance less than a minimum resolvable distance of an overlay metrology system.

5. The method of claim 1,
wherein the overlay region of the substrate contains a first overlay region corresponding to a first overlay mark and a second overlay region corresponding to a second overlay mark;
wherein the first and second overlay marks are not contiguous; and
wherein the overlay mark fin is disposed within the first and second overlay regions.

6. The method of claim 1, further comprising removing the remaining one or more dielectric layers after the etching of the substrate.

7. The method of claim 1, wherein the forming of the spacer forms the spacer on a side surface of the hard mask layer, and wherein the cutting of the overlay mark fin forms the fin line-end directed perpendicular to the side surface of the hard mask layer and directed perpendicular to a top surface of the substrate.

8. A method comprising:
receiving a substrate having an overlay region;
forming one or more dielectric layers on the substrate;
forming a hard mask layer on the one or more dielectric layers;
patterning the hard mask layer to form a hard mask layer feature, the hard mask layer feature configured to define an overlay mark fin disposed within the overlay region;
forming a first spacer on the patterned hard mask layer, the first spacer further defining the overlay mark fin;
etching the one or more dielectric layers using the first spacer, the etching of the dielectric layers further defining the overlay mark fin; and
etching the substrate using the etched one or more dielectric layers, the etching of the substrate further defining the overlay mark fin.

9. The method of claim 8,
wherein the hard mask layer feature is a first hard mask layer feature and is configured to define a first overlay mark fin having a longitudinal body directed along a first axis; and
wherein patterning the hard mask layer further forms a second hard mask layer feature, the second hard mask layer feature configured to define a second overlay mark fin disposed within the overlay region and having a longitudinal body directed along a second axis substantially perpendicular to the first axis.

10. The method of claim 8, wherein the hard mask layer feature is configured to define the overlay mark fin having a longitudinal body directed along a first axis and having a second longitudinal body directed along a second axis substantially perpendicular to the first axis.

11. The method of claim 8, wherein the hard mask layer feature is configured to define a first overlay mark fin and a second overlay mark fin disposed at a distance less than a minimum resolvable distance of an overlay metrology system.

12. The method of claim 8,
wherein the overlay region of the substrate contains a first overlay region corresponding to a first overlay mark and a second overlay region corresponding to a second overlay mark;
wherein the first and second overlay marks are not contiguous; and
wherein the overlay mark fin is disposed within the first and second overlay regions.

13. The method of claim 8, further comprising removing the remaining one or more dielectric layers after the etching of the substrate.

* * * * *